United States Patent
Owa

(10) Patent No.: US 6,707,695 B2
(45) Date of Patent: Mar. 16, 2004

(54) NONVOLATILE SEMICONDUCTOR MEMORY DEVICE

(75) Inventor: Yoshihito Owa, Hakushu-machi (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 10/153,736

(22) Filed: May 24, 2002

(65) Prior Publication Data

US 2002/0181267 A1 Dec. 5, 2002

(30) Foreign Application Priority Data

May 31, 2001 (JP) ...................................... 2001-165451

(51) Int. Cl.⁷ .................................................. G11C 5/06
(52) U.S. Cl. ...................... 365/63; 365/51; 365/185.13
(58) Field of Search .................... 365/63, 51, 185.13, 365/185.11, 230.03, 52, 72, 230.04

(56) References Cited

U.S. PATENT DOCUMENTS

| | | |
|---|---|---|
| 5,408,115 A | 4/1995 | Chang |
| 5,422,504 A | 6/1995 | Chang et al. |
| 5,494,838 A | 2/1996 | Chang et al. |
| 5,963,465 A | 10/1999 | Eitan |
| 5,969,383 A | 10/1999 | Chang et al. |
| 6,128,210 A * | 10/2000 | Suminaga et al. ............ 365/63 |
| 6,177,318 B1 | 1/2001 | Ogura et al. |
| 6,248,633 B1 | 6/2001 | Ogura et al. |
| 6,255,166 B1 | 7/2001 | Ogura et al. |

FOREIGN PATENT DOCUMENTS

| | | |
|---|---|---|
| JP | A7-161851 | 6/1995 |
| JP | B1 2978477 | 9/1999 |
| JP | A 2001-156188 | 6/2001 |

OTHER PUBLICATIONS

Hayashi et al., "Twin MONOS Cell with Dual Control Gates", IEEE VLSI Technology Digest, 2000.
Chang et al., "A New SONOS Memory Using Source–Side Injection for Programming", IEEE Electron Device Letter, vol. 19, No. 7, 1998, pp. 253–255.
Chen et al., "A Novel Flash Memory Device with S Plit Gate Source Side Injection and ONO Charge Storage Stack (SPIN)", VLSI Technology Digest, 1997, pp. 63–64.
U.S. patent application Ser. No. 10/153,686, Owa, filed May 24, 2002.
U.S. patent application Ser. No. 10/153,611, Owa, filed May 24, 2002.
U.S. patent application Ser. No. 09/955,160, Kanai et al., filed Sep. 19, 2001.
U.S. patent application Ser. No. 09/955,158, Kanai et al., filed Sep. 19, 2001.
U.S. patent application Ser. No. 10/115,913, Kamei, filed Apr. 5, 2002.
U.S. patent application Ser. No. 10/115,956, Kamei, filed Apr. 5, 2002.

* cited by examiner

Primary Examiner—David Lam
(74) Attorney, Agent, or Firm—Oliff & Berridge, PLC

(57) ABSTRACT

A nonvolatile semiconductor memory device having: a memory cell array region including a plurality of memory cells each of which has two MONOS memory cells and is controlled by a word gate and control gates, are arranged in first and second directions; and first and second select regions. The memory cell array region has a plurality of sub bit lines formed of impurity layers extending to the first and second select regions in the first direction, a plurality of sub control gate lines extending in the first direction, and a plurality of word lines extending in the second direction. Each of the first and second select regions has a sub bit select circuit which selectively connects the plurality of sub bit lines with main bit lines, when the number of the main bit lines is smaller than the number of the sub bit lines.

18 Claims, 11 Drawing Sheets

NONVOLATILE SEMICONDUCTOR MEMORY DEVICE

Japanese Patent Application No. 2001-165451, filed on May 31, 2001, is hereby incorporated by reference in its entirety.

BACKGROUND OF THE INVENTION

The present invention relates to a nonvolatile semiconductor memory device including memory cells, each of the memory cells having two nonvolatile memory elements and being controlled by one word gate and two control gates.

As one type of nonvolatile semiconductor memory device, a MONOS (Metal-Oxide-Nitride-Oxide-Semiconductor or Metal-Oxide-Nitride-Oxide-Substrate) device is known. In the MONOS nonvolatile semiconductor memory device, a gate insulating layer between a channel and a gate is formed of a laminate consisting of a silicon oxide film, silicon nitride film, and silicon oxide film. Charges are trapped in the silicon nitride film.

The MONOS nonvolatile semiconductor memory device is disclosed in literature (Y. Hayashi, et al., 2000 Symposium on VLSI Technology Digest of Technical Papers, pp. 122–123). This literature discloses a twin MONOS flash memory cell including two nonvolatile memory elements (MONOS memory cells) controlled by one word gate and two control gates. Specifically, one flash memory cell has two charge trap sites.

In order to drive the twin MONOS flash memory cell, two bit lines, one word line, and two control gate lines are necessary.

Of these interconnects, two bit lines and two control gate lines are generally wired in the column direction. However, it is difficult to provide four interconnects (two bit lines and two control gate lines) within the width of a plurality of memory cells in one column using the same metal interconnect layer even in the case of using a photolithographic process with a minimum line & space width.

Therefore, the wiring space must be secured by increasing the width of the memory cells in one column. However, this causes a decrease in the degree of integration of the memory cells, whereby it is impossible to deal with a recent increase in the capacity of the nonvolatile semiconductor memory device.

BRIEF SUMMARY OF THE INVENTION

The present invention may provide a highly integrated nonvolatile semiconductor memory device in which each memory cell has two trap sites.

The present invention may also provide a nonvolatile semiconductor memory device capable of securing the degree of margin and freedom for the arrangement of metal interconnects by extending impurity layers to provide bit lines without metal interconnects as the bit lines.

According to one aspect of the present invention, there is provided a nonvolatile semiconductor memory device comprising: a memory cell array region in which a plurality of memory cells are arranged in first and second directions intersecting each other, each of the memory cells having two nonvolatile memory elements and being controlled by one word gate and two control gates; and a select region disposed adjacent to the memory cell array region in the first direction.

The memory cell array region includes: a plurality of sub bit lines formed of impurity layers extending to the select region in the first direction, and provided on both sides of the memory cells arranged in the first direction; a plurality of control gate lines extending in the first direction, the number of the control gate lines being twice the number of the sub bit lines; a plurality of word lines extending in the second direction; a plurality of main bit lines extending in the first direction and provided within the select region and the memory cell array region, the number of the main bit lines being smaller than the number of the sub bit lines; and a sub bit select circuit which is provided in the select region and selectively connects the sub bit lines with the main bit lines.

In this aspect of the present invention, the plurality of sub bit lines are formed of the impurity layers extending from the memory cell array region to the select region. Therefore, metal interconnects for backing the plurality of sub bit lines are unnecessary. As a result, a large number of metal interconnects can be omitted for the sub bit lines. This produces a surplus of space which can be assigned to other metal interconnects, whereby the degree of freedom for the metal interconnects can be increased.

Moreover, since the number of main bit lines can be less than the number of sub bit lines, a surplus of wiring space is produced for a layer in which the main bit lines are disposed, whereby the degree of freedom relating to the wiring can be increased.

Therefore, there is no need to decrease the degree of integration in order to secure space for the metal interconnects even if one memory cell has two trap sites, whereby a highly integrated nonvolatile semiconductor memory device can be provided.

In this nonvolatile semiconductor memory device, the select region may include first and second select regions disposed on both sides of the memory cell array region in the first direction.

The degree of freedom for each interconnect is further increased by dividing the select region to which the plurality of sub bit lines and the plurality of sub control gate lines extend in two.

In this nonvolatile semiconductor memory device, an even-numbered sub bit line among the sub bit lines may extend to the first select region; and an odd-numbered sub bit line among the sub bit lines may extend to the second select region.

This enables circuits for selectively connecting the sub bit lines with the main bit lines to be separately disposed in the first and second select regions based on odd numbers and even numbers, whereby the circuit layout is simplified.

Specifically, the first select region may include an even-numbered sub bit select circuit which selectively connects the even-numbered sub bit line with even-numbered main bit line among the main bit lines; and the second select region may include an odd-numbered sub bit select circuit which selectively connects the odd-numbered sub bit line with odd-numbered main bit line among the main bit lines.

The memory cell array region may include a plurality of common connection sections each of which connects two of the control gate lines disposed on both sides of each of the sub bit lines, at one end portion of the memory cell array region on the side opposite to the side on which the sub bit line between the two of the control gate lines extends to the select region. In this case, a plurality of sub control gate lines may connect the common connection sections to the select region, the number of the sub control gate lines being equal to the number of the sub bit lines.

A plurality of main control gate lines may be provided to extend in the first direction in the select region and the memory cell array region, and the number of the main control gate lines may be smaller than the number of the sub control gate lines. In this case, the select region may include a sub control gate select circuit which selectively connects the sub control gate lines with the main control gate lines.

This enables the number of main control gate lines to be smaller than the number of sub control gate lines, whereby a surplus of wiring space is produced because the total number of interconnects decreases even if the main control gate lines are disposed in the same layer as the main bit lines.

Two of the control gate lines on both sides of the odd-numbered sub bit line may be connected to each other by an odd-numbered common connection section of the common connection sections at one end in the first direction; and two of the control gate lines on both sides of even-numbered sub bit line may be connected to each other by an even-numbered common connection section of the common connection sections at the other end in the first direction.

By alternately providing the odd-numbered and even-numbered common connection sections on opposite ends of the memory cell array region in the first direction, the odd-numbered and even-numbered sub control gate lines connected to the common connection sections can be disposed in opposite directions.

Specifically, the odd-numbered common connection section may be connected to an odd-numbered sub control gate line extending to the first select region.

The even-numbered common connection section may be connected to an even-numbered sub control gate line extending to the second select region.

This enables the length of the sub control gate lines which connect the memory cell array region with the select region to be minimized.

In this case, the first select region may have an odd-numbered sub control gate select circuit which selectively connects the odd-numbered sub control gate line to an odd-numbered main control gate line. The second select region may have an even-numbered sub control gate select circuit which selectively connects the even-numbered sub control gate line to an even-numbered main control gate line.

Since the control gate select circuits can be dispersed in the first and second select regions in this manner, the circuit layout can be simplified.

If a memory block is formed of the memory cell array region and the select region, a plurality of the memory cells may be arranged in the first direction. This enables an increase in the storage capacity of the nonvolatile semiconductor memory device. Moreover, since the length of the sub control gate lines and the sub bit lines can be decreased, the wiring capacitance can be reduced. Furthermore, since data can be collectively erased in the block unit, the erase unit can be reduced in comparison with the case of erasing data over the entire memory.

In this case, a main bit line driver which drives the plurality of main bit lines may be provided on one end of the arranged memory blocks in the first direction.

This enables the plurality of main bit lines to be shared by the plurality of memory blocks, and the main bit line driver to be shared by the plurality of memory blocks.

Moreover, a main control gate line driver which drives the plurality of main control gate lines may be provided on the other end of the arranged memory blocks in the first direction.

This enables the plurality of main control gate lines to be shared by the plurality of memory blocks, and the main control gate line driver to be shared by the plurality of memory blocks.

A word line driver which drives the word lines may be provided on either side of the arranged memory blocks in the second direction. In order to further increase the storage capacity of the nonvolatile semiconductor memory device, the plurality of memory blocks may be disposed on both sides of the word line driver in the second direction.

The plurality of sub control gate lines may form a first metal interconnect layer. A second metal interconnect layer perpendicular to the first metal interconnect layer may be connected with the plurality of word lines extending in the second direction.

A third metal interconnect layer perpendicular to the second metal interconnect layer may be used as the main bit lines and the main control gate lines.

Since an excessive increase in the number of interconnects can be prevented in the first to third layers, the degree of margin of wiring can be secured.

Two nonvolatile memory elements in each memory cell of the nonvolatile semiconductor memory device according to one aspect of the present invention may has an ONO film consisting of an oxide film (O), nitride film (N), and oxide film (O) as a charge trap site. However, other types of structures may be employed.

DETAILED DESCRIPTION OF THE EMBODIMENT

An embodiment of the present invention is described below with reference to the drawings.

Structure of Memory Cell

Figure 1:
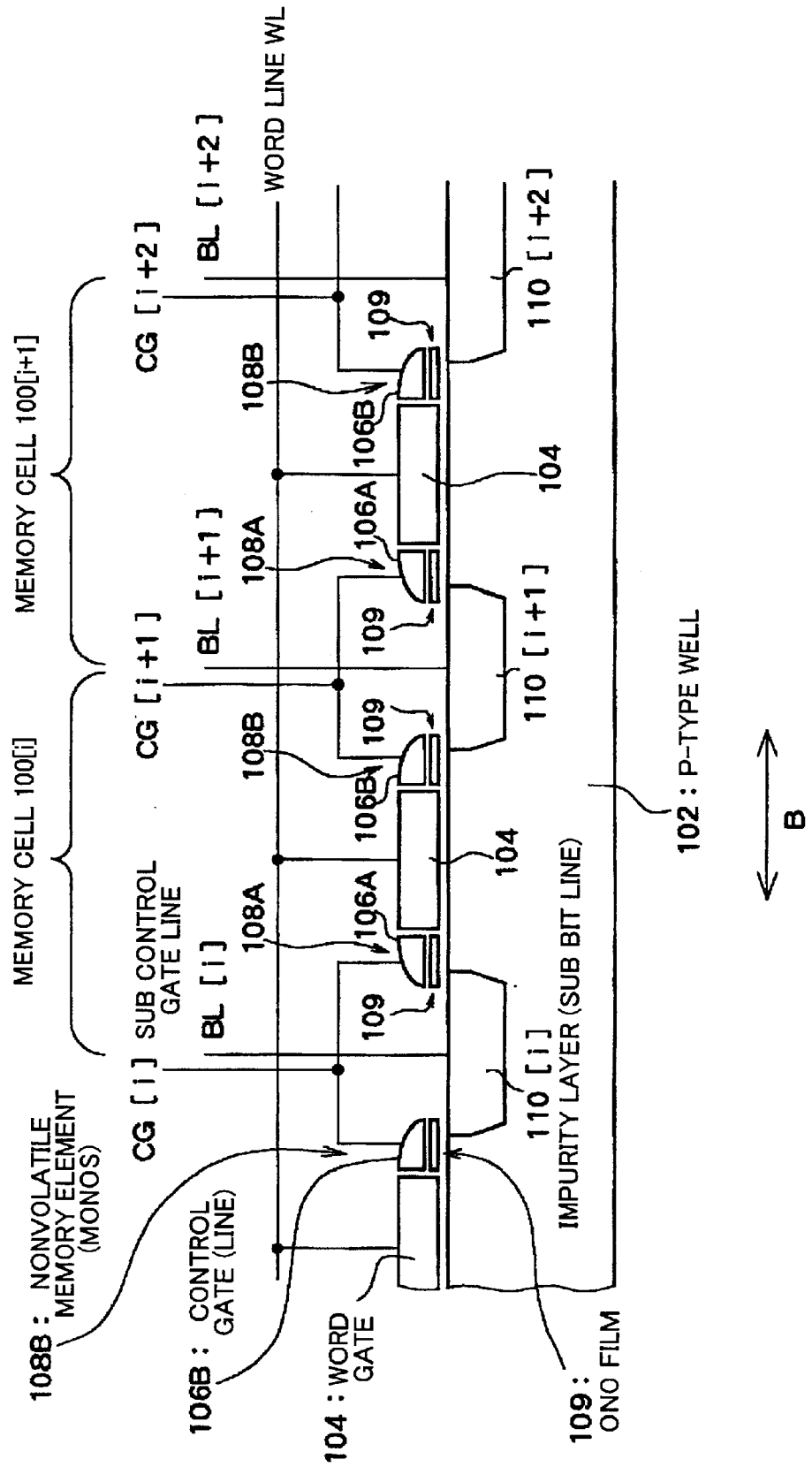
FIG. 1 is a cross-sectional view showing memory cells used in a nonvolatile semiconductor memory device according to one embodiment of the present invention.
Figure 2:
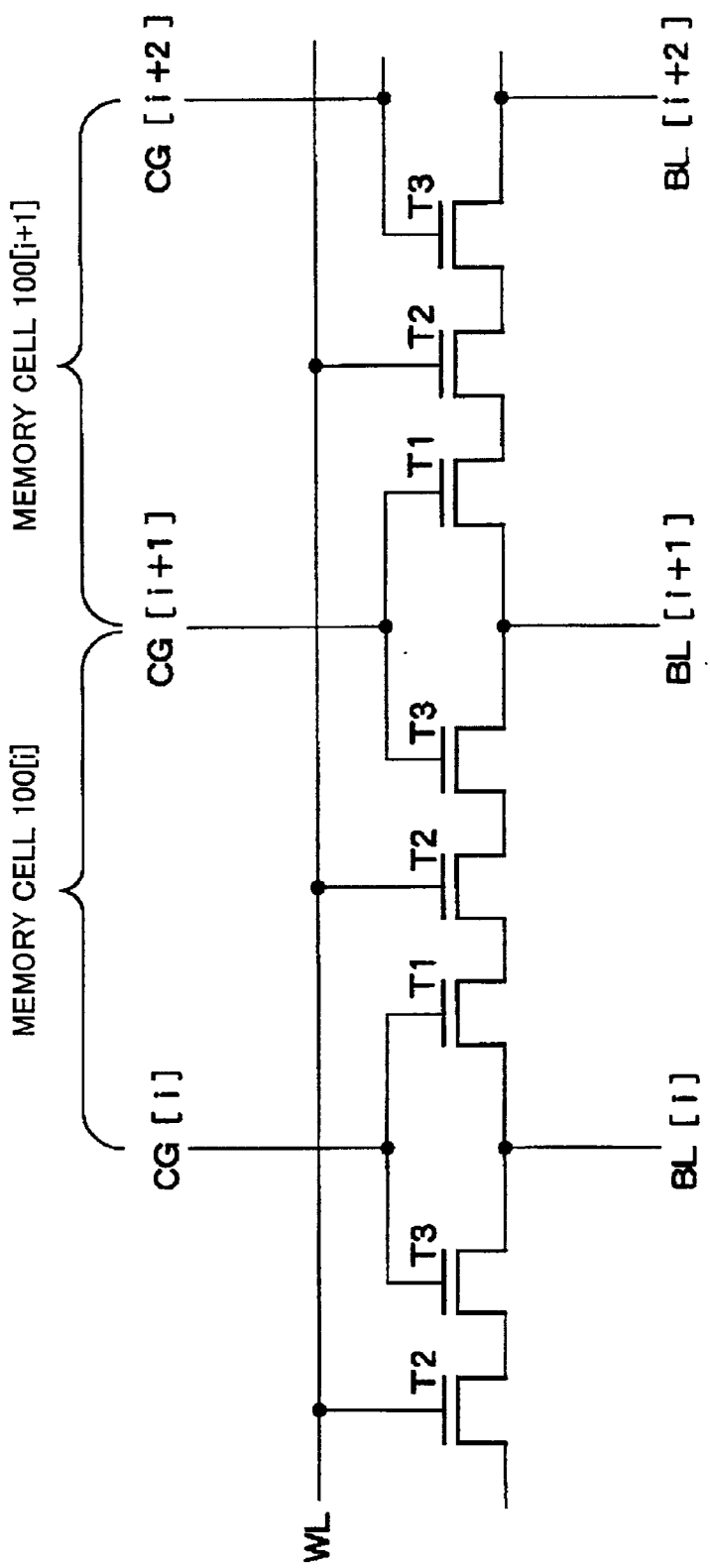
FIG. 2 is an equivalent circuit diagram of the memory cells shown in FIG. 1.

FIG. 1 is a view showing a cross section of a nonvolatile semiconductor memory device. FIG. 2 is an equivalent circuit diagram of the nonvolatile semiconductor memory device. In FIG. 1, one memory cell 100 includes a word gate 104 formed of a material containing polysilicon, for example, on a P-type well region 102 on a silicon substrate through a gate oxide film, a nonvolatile memory element (MONOS memory cell) 108A including a control gate 106A, and a nonvolatile memory element (MONOS memory cell) 108B including a control gate 106B.

The control gates 106A and 106B are formed on opposite sidewalls of the word gate 104. The control gates 106A and 106B are electrically insulated from the word gate 104.

Each of the memory elements 108A and 108B includes an ONO film 109, in which an oxide film (O), nitride film (N), and oxide film (O) are layered, formed between either the control gate 106A or 106B corresponding to M (Metal) in the MONOS and the P-type well 102 corresponding to S (Silicon) in the MONOS. The control gates 106A and 106B may be formed using a conductive material such as doped silicon or silicide.

Therefore, one memory cell 100 includes two MONOS memory cells 108A and 108B, each having a split gate (control gates 106A and 106B). One word gate 104 is shared by the MONOS memory cells 108A and 108B.

The MONOS memory cells 108A and 108B function as charge trap sites. Each of the MONOS memory cells 108A and 108B can trap charges in the ONO film 109.

As shown in FIGS. 1 and 2, a plurality of word gates 104 arranged at intervals in the row direction (second direction B in FIGS. 1 and 2) is connected in common with one word line WL formed of a polycide or the like.

The control gates 106A and 106B shown in FIG. 1 extend in the column direction (first direction A perpendicular to the surface of FIG. 1), and are shared by a plurality of memory cells 100 arranged in the column direction. In the following description, the control gates 106A and 106B may be referred to as control gate lines.

A sub control gate line CG [i+1] consisting of a second metal layer formed in an upper layer of the control gate lines is connected with the control gate line 106B in the [i]th memory cell 100 [i] and the control gate line 106A in the [i+1]st memory cell 100 [i+1].

An [i+1]st impurity layer 110 [i+1] shared by the MONOS memory cell 108B in the [i]th memory cell 100 [i] and the MONOS memory cell 108A in the [i+1]st memory cell 100 [i+1] is formed in the P-type well 102.

The impurity layers 110 [i], [i+1], and [i+2] are formed in the P-type well and extend in the column direction (first direction A perpendicular to the surface of FIG. 1), for example. The impurity layers 110 [i], [i+1], and [i+2] function as sub bit lines BL [i], [i+1], and [i+2] shared by a plurality of memory cells 100 arranged in the column direction. Therefore, in the present embodiment, the impurity layers 110 [i], [i+1], and [i+2] are sub bit lines BL [i], [i+1], and [i+2].

Data Read Operation from Memory Cell

As shown in FIG. 2, a transistor T2 driven by the word gate 104 and transistors T1 and T3 respectively driven by the control gates 106A and 106B are connected in series in one memory cell 100.

Figure 3:
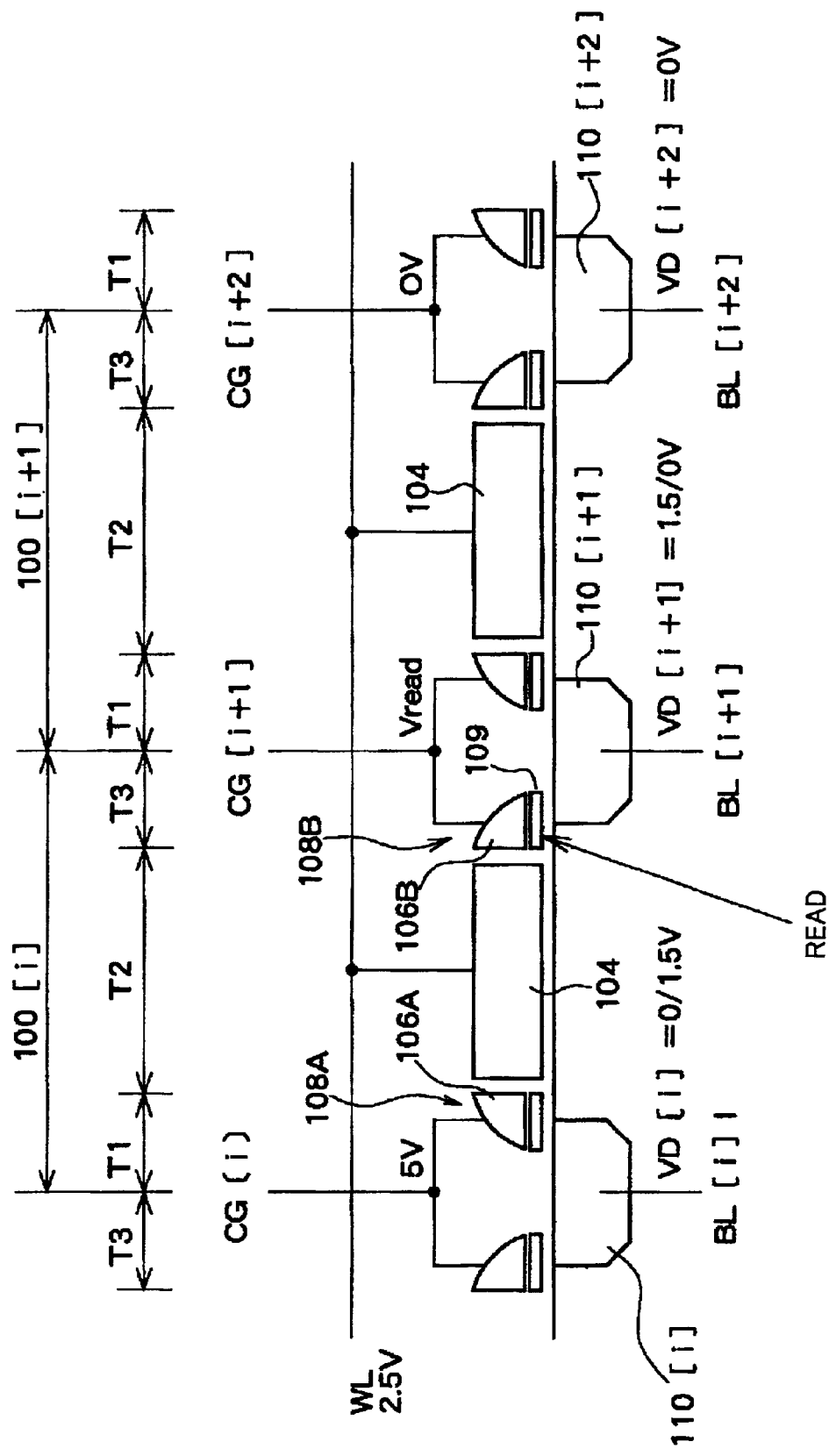
FIG. 3 is schematically illustrative of a data read operation of the nonvolatile semiconductor memory device shown in FIG. 1.

Setting of the potential at each point of two adjacent memory cells 100 [i] and [i+1] is described below with reference to FIG. 3. FIG. 3 is a view for describing reading of data from the MONOS memory cell 108B on the right of the word gate 104 in the memory cell 100 [i]. The following description of the operation is given on the assumption that the threshold voltage of the transistors T1–T3 is less than 2.5 V.

Each of the transistors T2 is turned ON by applying 2.5 V to each of the word gates 104, for example. The transistor T1 corresponding to the MONOS memory cell 108A is turned ON by applying an override voltage (5 V, for example) to the control gate 106A on the left side of the memory cell 100 [i] through the sub control gate line CG [i]. A read potential Vread is applied as a potential VCG of the control gate 106B on the right side of the memory cell 100 [i].

The operation of the transistor T3 corresponding to the MONOS memory cell 108B differs as described below depending upon whether or not charges are stored in the MONOS memory cell 108B on the right of the word gate 104.

Figure 4:
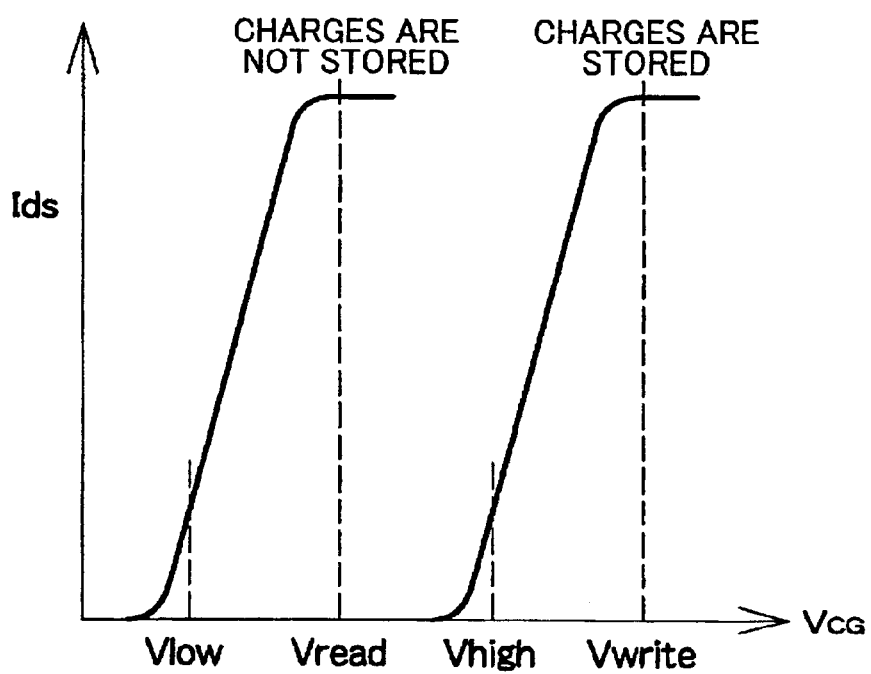
FIG. 4 is a characteristic diagram showing the relationship between a control gate voltage VCG and source-drain current Ids in the memory cells shown in FIG. 1.

FIG. 4 shows the relation between a voltage applied to the control gate 106B on the right side of the memory cell 100 [i] and a current Ids which flows between the source and drain of the transistor T3 corresponding to the MONOS memory cell 108B controlled by this voltage.

As shown in FIG. 4, in the case where charges are not stored in the MONOS memory cell 108B, the current Ids flows when the control gate potential VCG exceeds a lower threshold voltage Vlow. In the case where charges are stored in the MONOS memory cell 108B, the current Ids does not flow unless the control gate potential VCG exceeds a higher threshold voltage Vhigh.

The voltage Vread applied to the control gate 106B at the time of reading data is set to approximately an intermediate voltage (2.5 V, for example) between the two threshold voltages Vlow and Vhigh.

Therefore, the current Ids flows if charges are not stored in the MONOS memory cell 108B, and the current Ids does not flow if charges are stored in the MONOS memory cell 108B.

At the time of reading data, the impurity layer 110 [i] (sub bit line BL [i]) is connected to a sense amplifier, and a potential VD [i+1] of the impurity layer 110 [i+1] (sub bit line BL [i+1]) is set to 1.5 V. This allows the current Ids to flow when charges are not stored in the MONOS memory cell 108B, whereby a current of 25 μA or more flows through the sub bit line BL [i] through the transistors T1 and T2 in an ON state, for example. Since the current Ids does not flow when charges are stored in the MONOS memory cell 108B, current flowing through the sub bit line BL [i] is less than 10 nA even if the transistors T1 and T2 are in an ON state, for example. Therefore, data can be read from the MONOS memory element 108B (selected cell) in the twin memory cell 100 [i] by detecting the current flowing through the sub bit line BL [i] using the sense amplifier.

The transistors T1 and T2 are turned ON in the memory cell 100 [i+1]. However, since the control gate potential VCG of the transistor T3 is set to 0 V, which is lower than the threshold voltages Vlow and Vhigh shown in FIG. 3, the source-drain current does not flow in the memory cell 100 [i+1]. Therefore, data storage conditions in the memory cell 100 [i+1] do not adversely affect the reading of data from the memory cell 100 [i].

In the case of reading data from the MONOS memory cell 108A on the left side of the memory cell 100 [i], the potential at each point of the memory cell 100 [i−1] and [i] is set in the same manner as described above.

Programming of Memory Cell

Figure 5:
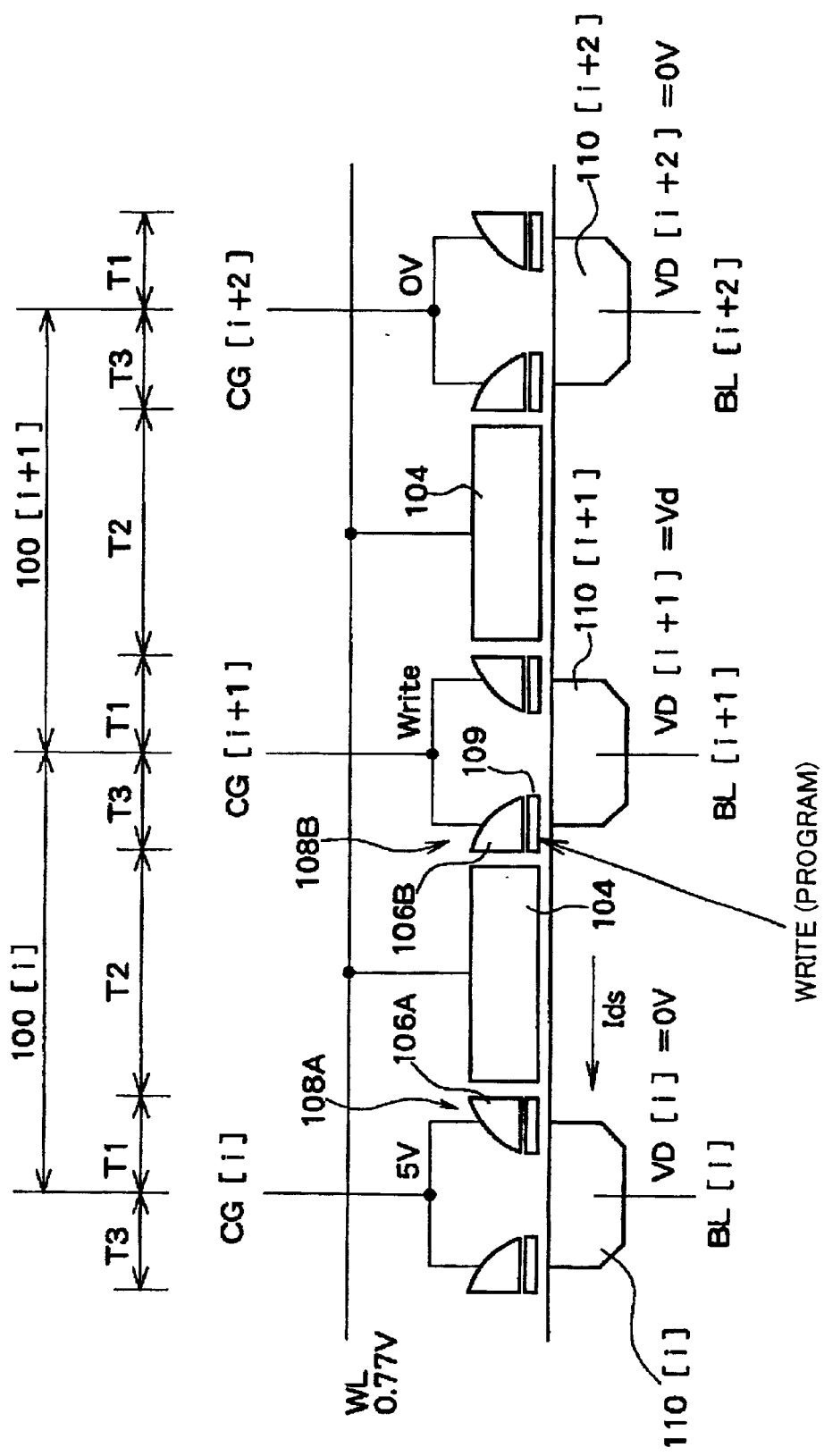
FIG. 5 is schematically illustrative of a data write (program) operation of the nonvolatile semiconductor memory device shown in FIG. 1.

FIG. 5 is a view for describing data programming of the MONOS memory cell 108B on the right of the word gate 104 in the memory cell 100 [i]. A data erase operation described later has been performed before this data program operation.

In FIG. 5, the potential of the sub control gate line CG [i] is set to the override potential (5 V, for example), and the potential of the sub control gate line CG [i+2] is set to 0 V in the same manner as shown in FIG. 3. However, the potential of each word gate 104 is set to about 0.77 V to 1 V by the word line WL, for example. The potential of the control gate 108B on the right side of the memory cell 100 [i] is set to the write potential Vwrite (5–6 V, for example) shown in FIG. 4, through the sub control gate line CG [i+1]. The potential VD [i+1] of the [i+1]st impurity layer 110 [i+1] is set to 4.5–5 V, for example.

This causes the transistors T1 and T2 in the memory cell 100 [i] to be turned ON, whereby the current Ids flows toward the impurity layer 110 [i] and channel hot electrons (CHE) are trapped in the ONO film 109 of the MONOS memory cell 108B. The program operation of the MONOS memory cell 108B is performed in this manner, whereby data "0" or "1" is written in.

Data Erase of Memory Cell

Figure 6:
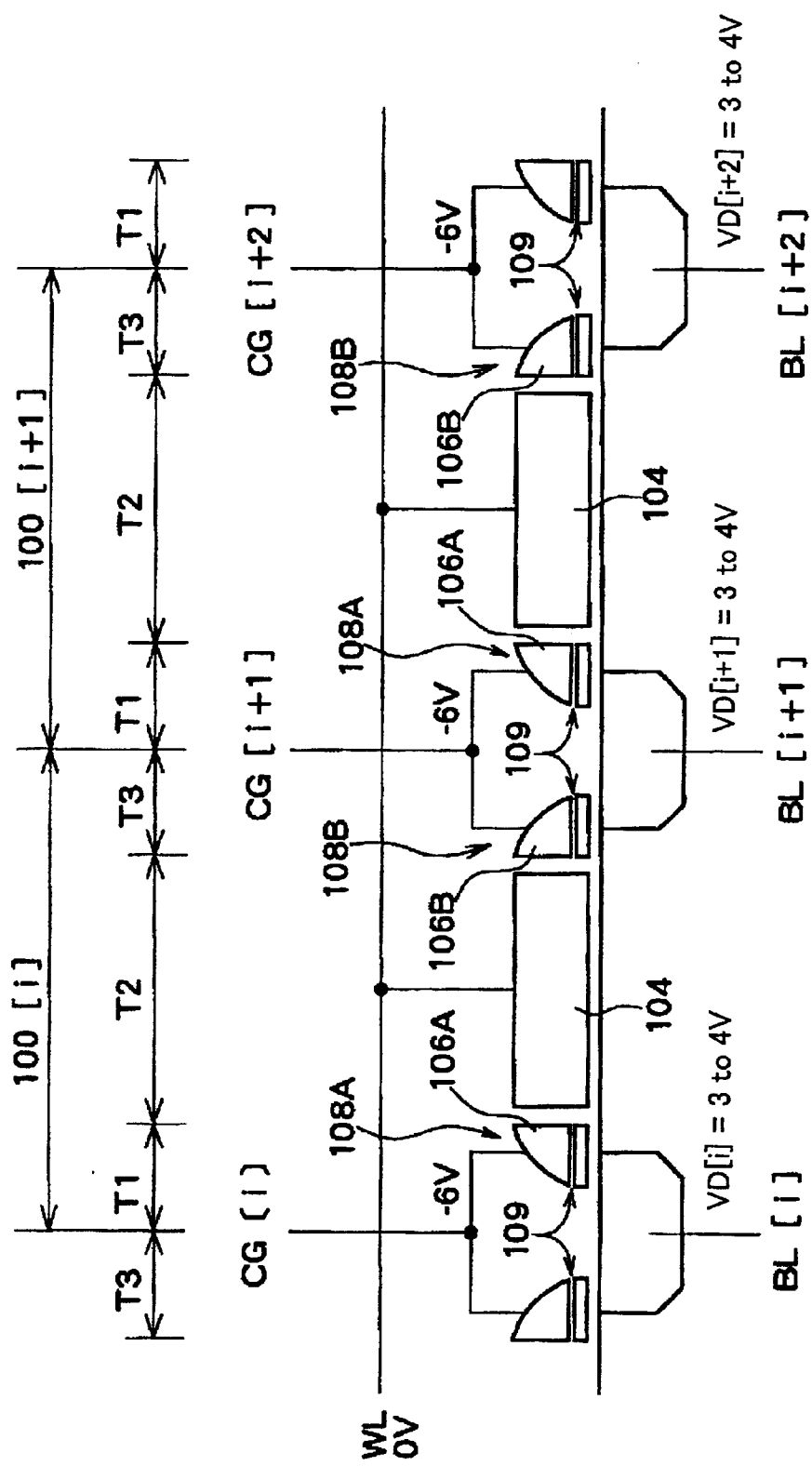
FIG. 6 is schematically illustrative of a data erase operation of the nonvolatile semiconductor memory device shown in FIG. 1.

FIG. 6 is a view for describing data erase of the memory cells 100 [i] and [i+1] connected to the word line WL.

In FIG. 6, the potential of each word gate 104 is set to 0 V by the word line WL. The potential of the control gates 106A and 106B is set to –5 to –6 V by the sub control gate lines CG [i], [i+1], and [i+2], for example. The potential of the impurity layers (sub bit lines) 110 [i], [i+1], and [i+2] is set to 3–4 V (equal to the potential of the P-type well).

This causes electrons trapped in the ONO films 109 of the MONOS memory cells 108A and 108B to be extracted and erased by a tunnel effect caused by an electric field formed by –5 to –6V being applied to the metal (M) and 3 to 4 V being applied to the silicon (S). This enables data to be erased in a plurality of memory cells at the same time. Differing from the above example, the stored electrons may be erased by forming hot holes using band-band tunneling on the surface of the impurity layers which become the bit lines.

Entire Configuration of Nonvolatile Semiconductor Memory Device

The nonvolatile semiconductor memory device formed by using the above-described memory cells 100 is described below with reference to FIGS. 7 and 8.

Figure 7:
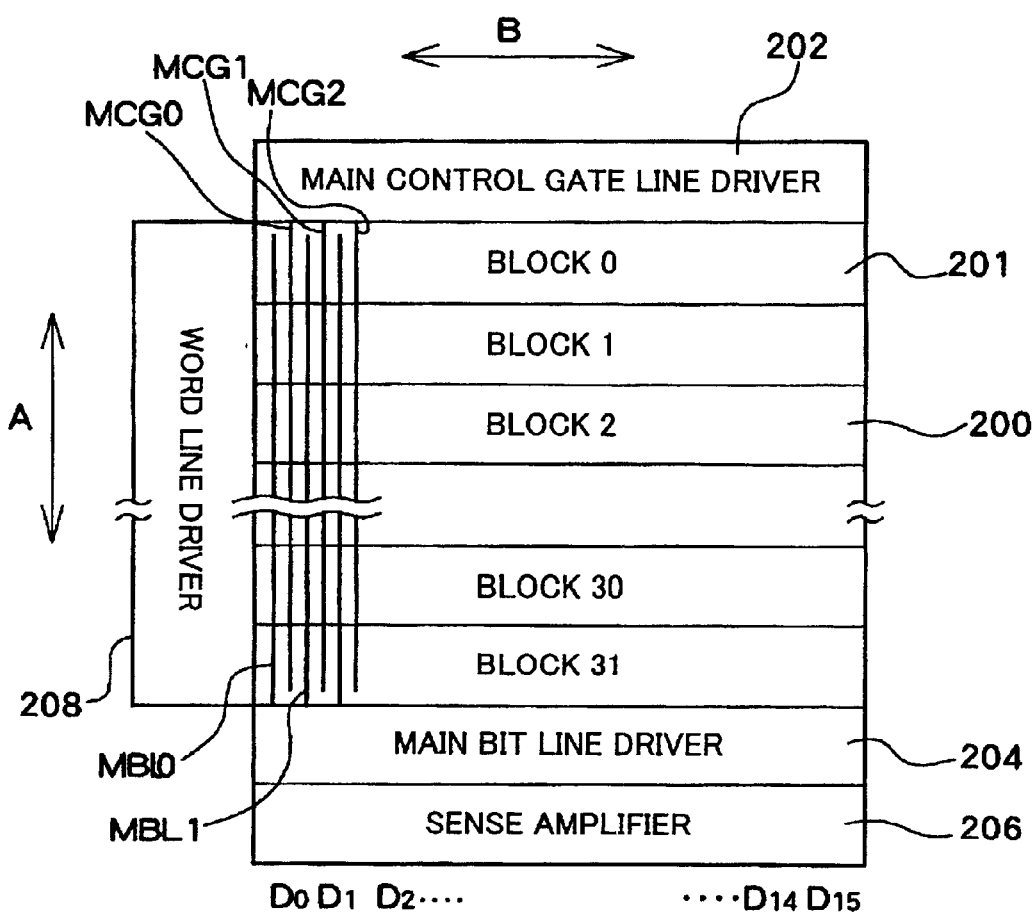
FIG. 7 shows a planar layout of the entire nonvolatile semiconductor memory device shown in FIG. 1.

FIG. 7 is a view showing a planar layout of the nonvolatile semiconductor memory device. A memory region 200 is divided into 32 memory blocks 201, for example. A main control gate line driver 202 is formed on one end of the memory region 200 in the first direction A. A main bit line driver 204 and a sense amplifier 206 are formed on the other end in the first direction A. A word line driver 208 is formed on one end of the memory region 200 in the second direction B.

The main control gate line driver 202 drives main control gate lines MCG0, MCG1, . . . formed of a third metal interconnect layer extending in the first direction A across the memory blocks 201 (blocks No. 0 to No. 31), for example.

The main bit line driver 204 drives main bit lines MBL0, MBL1, . . . formed of the third metal interconnect layer extending in the first direction A across the memory blocks 201 (blocks No. 0 to No. 31), for example.

Figure 8:
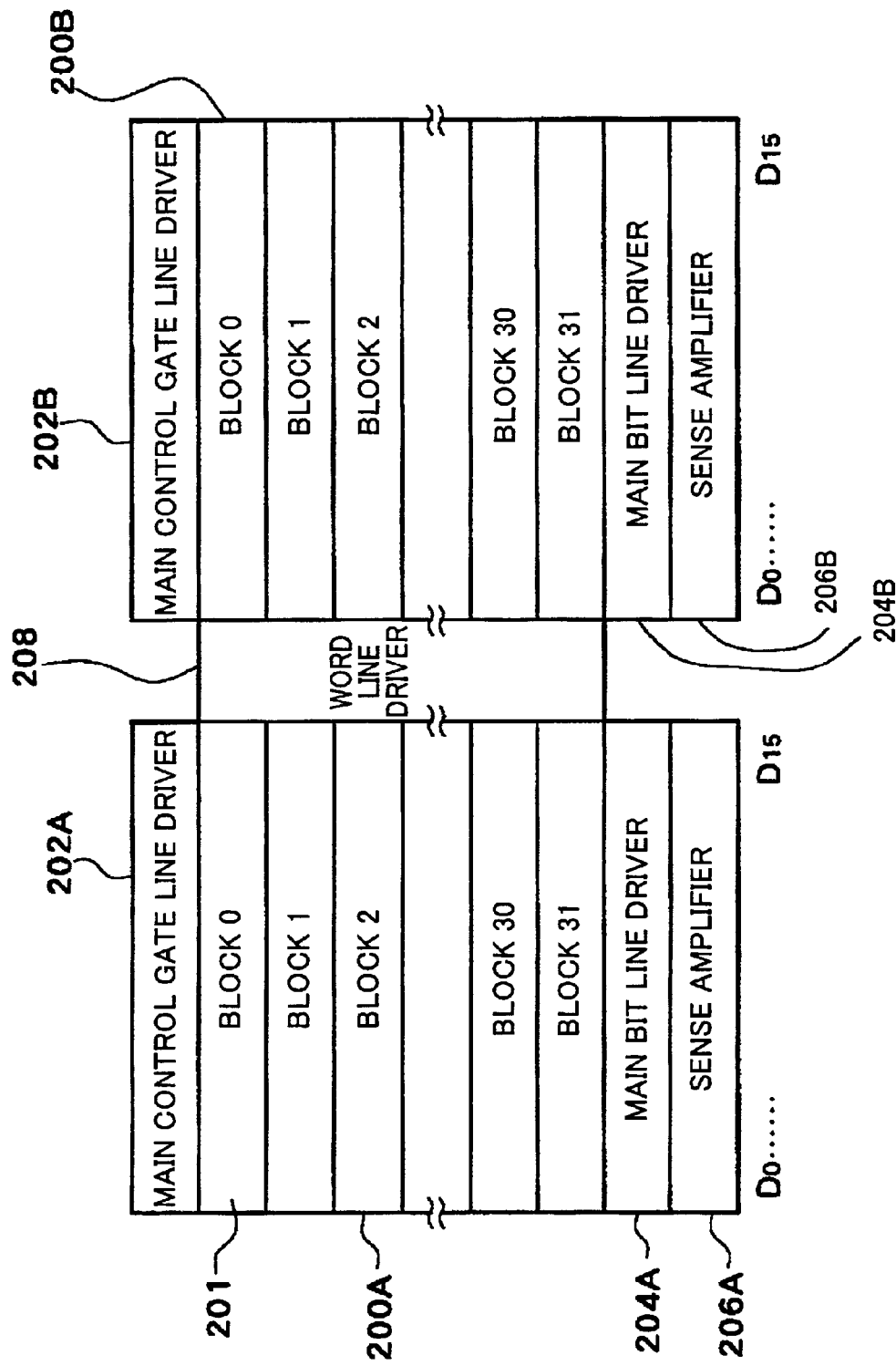
FIG. 8 shows another example of the planar layout of the entire nonvolatile semiconductor memory device shown in FIG. 1.

FIG. 8 is a view showing a nonvolatile semiconductor memory device having two memory regions 200A and 200B. A main control gate line driver 202A, a main bit line driver 204A, and a sense amplifier 206A are formed in the memory region 200A. A main control gate line driver 202B, a main bit line driver 204B, and a sense amplifier 206B are formed in the memory region 200B. The word line driver 208 is disposed between the memory regions 200A and 200B and shared by the memory regions 200A and 200B.

The layout of the nonvolatile semiconductor memory device is not limited to those shown in FIGS. 7 and 8. Various types of modifications are possible. In the case where the storage capacity of the memory region 200 is 16 Mbits, for example, the storage capacity of the nonvolatile semiconductor memory device having four memory regions 200 is 16×4=64 Mbits.

In each of the memory blocks 201 formed by dividing the memory region 200 having a storage capacity of 16 Mbits into 32 sections, 2 k (4 kbit) memory cells 100 are connected to one word line WL. 128 word lines WL are disposed in each memory block. Therefore, each memory block 201 has a storage capacity of 32 kwords (64 kbytes). In each of the memory regions 200 (200A and 200B) shown in FIGS. 7 and 8, 16-bit data can be read or written at the same time through output terminals D0 to D15 (each one bit).

Configuration of Memory Block

The configuration of one memory block 201 formed by dividing the memory region 200 into 32 sections, for example, is described below with reference to FIG. 9.

Figure 9:
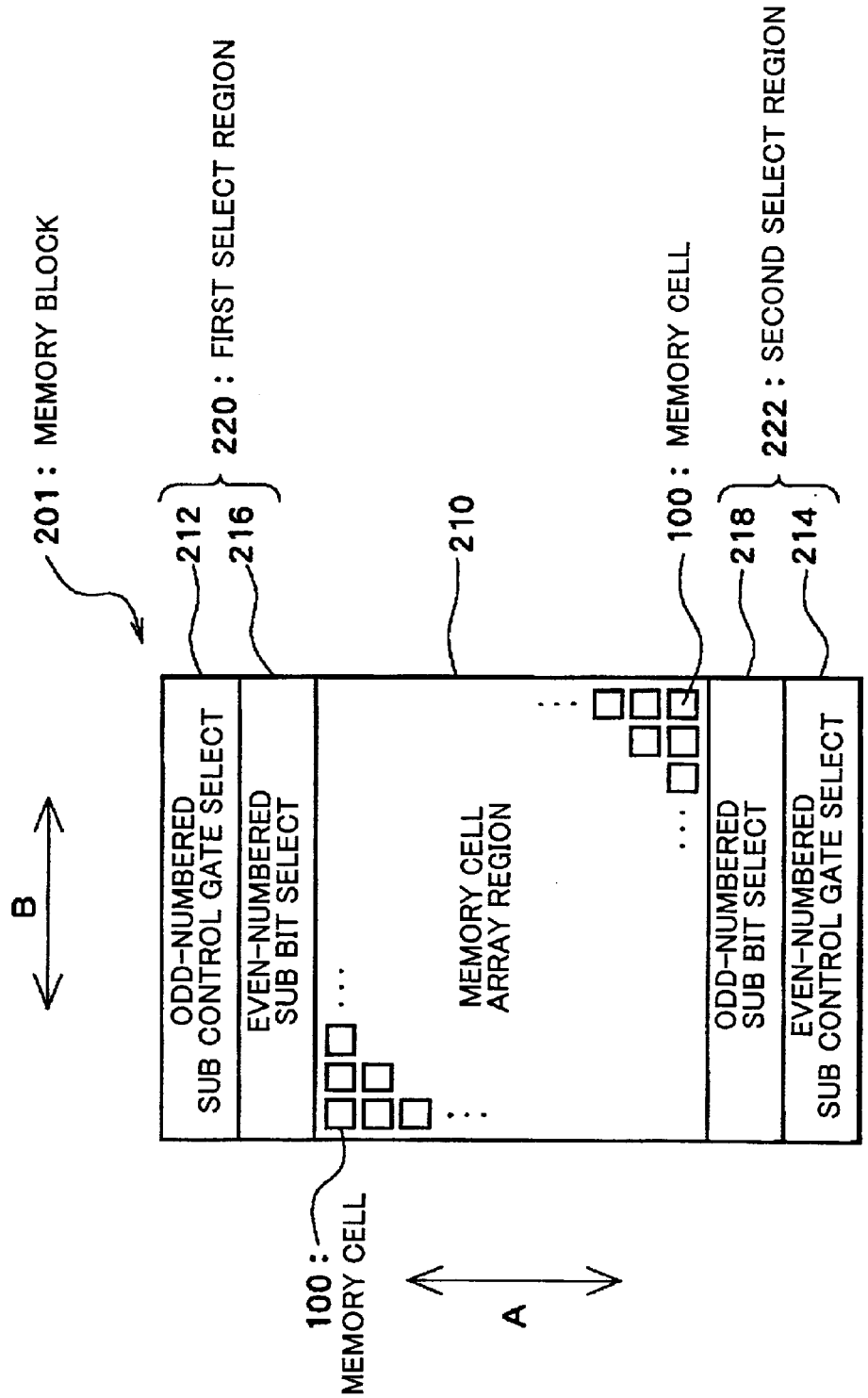
FIG. 9 shows a memory block shown in FIG. 7 or 8.

FIG. 9 is a view showing a planar layout of one memory block 201 shown in FIGS. 7 and 8. In FIG. 9, the memory block 201 includes a memory cell array region 210 in which a plurality of memory cells 100 is arranged in the first and second directions A and B which intersect each other. A first select region 220 and a second select region 222 are formed on opposite sides of the memory cell array region in the first direction A. The first select region 220 is divided into an odd-numbered sub control gate select circuit 212 and an even-numbered sub bit select circuit 216. The second select region 222 is divided into an even-numbered sub control gate select circuit 214 and an odd-numbered sub bit select circuit 218.

Figure 10:
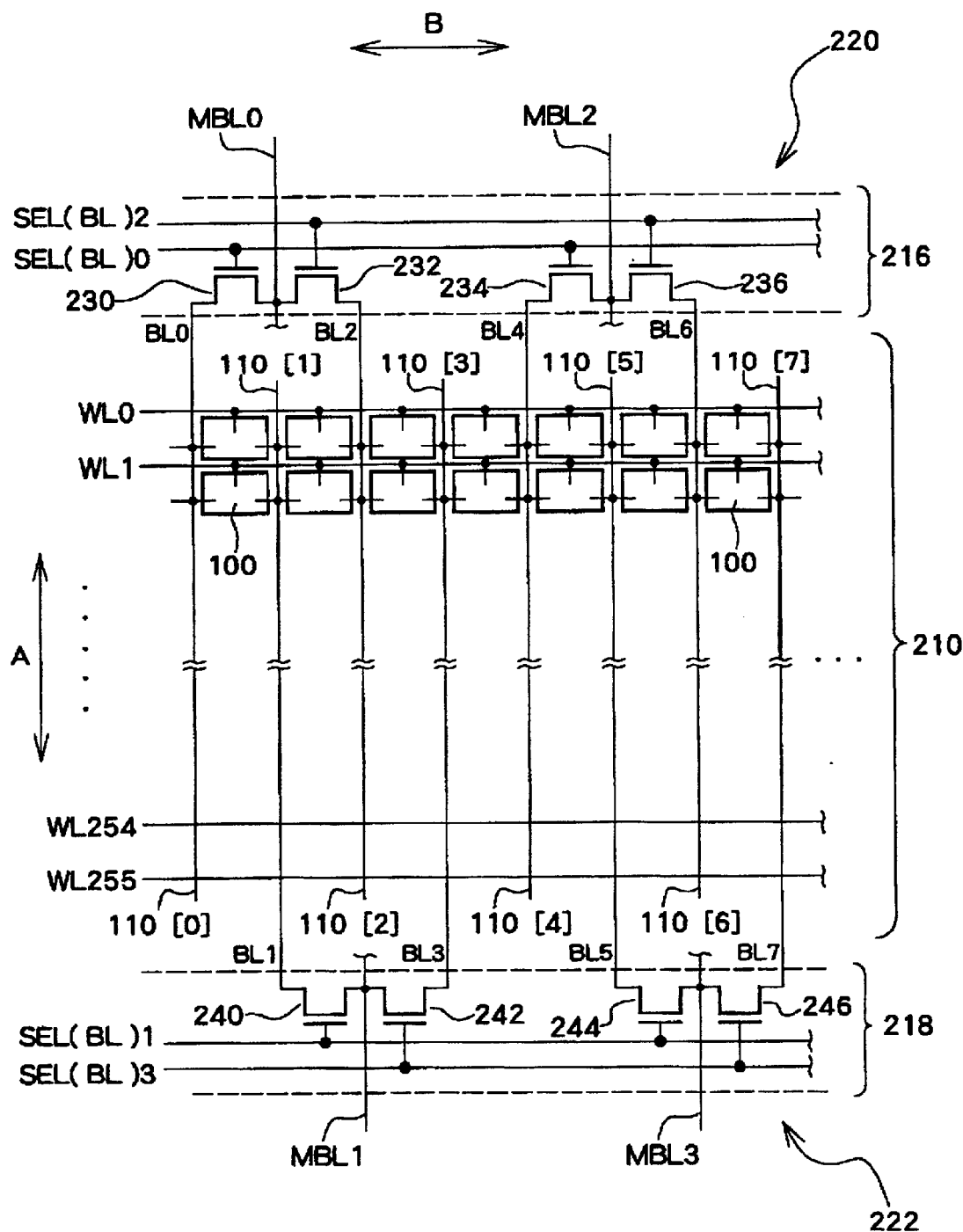
FIG. 10 is a wiring diagram showing the relationship between the sub bit lines and the main bit lines in a memory cell array.
Figure 11:
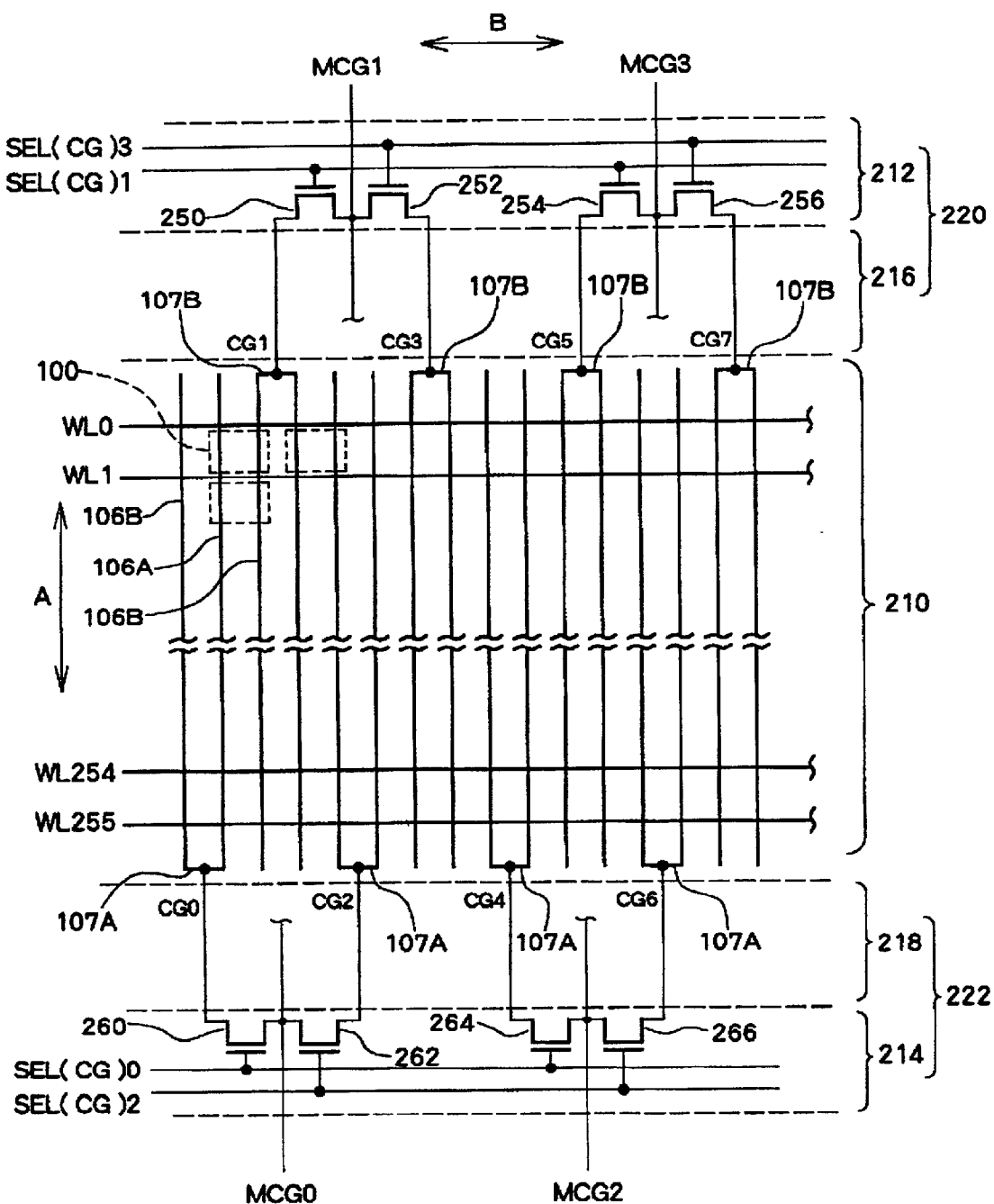
FIG. 11 is a wiring diagram showing the relationship between the sub control gate lines and the main control gate lines in the memory cell array.

FIGS. 10 and 11 are views showing the details of the memory cell array region 210 in the memory block 201. In FIGS. 10 and 11, 256 word lines WL0 to WL255 extending in the second direction B are formed of a polycide or the like in the memory cell array region 210, for example. These 256 word lines WL0 to WL255 are electrically connected to the word line driver 208 shown in FIG. 7 through a second metal interconnect layer 211.

The sub bit lines BL0, BL1, . . . shown in FIG. 10, which are the impurity layers 110 [0], 110 [1], . . . shown in FIG. 1, extend in the first direction A.

The control gate lines 106A and 106B are disposed on opposite sides of each of the sub bit lines BL0, BL1, . . . , as shown in FIG. 1. Therefore, the total number of the control gate lines 106A and 106B is approximately twice the total number of the sub bit lines BL0, BL1, . . .

In FIG. 10, the even-numbered sub bit lines BL0, BL2, BL4, . . . extend to the even-numbered sub bit select circuit 216 in the first select region 220 disposed on one end in the first direction A. The odd-numbered sub bit lines BL1, BL3, BL5, extend to the odd-numbered sub bit select circuit 218 in the second select region 222 disposed on the other end in the first direction A. Therefore, no metal interconnect layer is used to connect the sub bit lines BL0, BL1, . . . to the first and second select regions 220 and 222. In the case where the sub bit lines BL0, BL1, BL2 . . . formed by the impurity layers have a high resistance, the resistance may be decreased by forming a silicide on the surface of the impurity layers.

As shown in FIG. 11, each two control gate lines 106A and 106B on opposite sides of each of the even-numbered sub bit lines BL0, BL2, . . . are connected in common by even-numbered common connection sections 107A on one end in the first direction A. The even-numbered common connection sections 107A are disposed outside of one end of each of the even-numbered sub bit lines BL0, BL2, . . . in the first direction A. The even-numbered common connection sections 107A are connected to each of the even-numbered sub control gate lines CG0, CG2, . . . formed of the first metal interconnect layer, through contacts. Each of the even-numbered sub control gate lines CG0, CG2, . . . extends to the even-numbered sub control gate select circuit 214 in the second select region 222, as shown in FIG. 11.

As shown in FIG. 11, each two control gate lines 106A and 106B on opposite sides of each of the odd-numbered sub bit lines BL1, BL3, . . . are connected in common by odd-numbered common connection sections 107B on the other end in the first direction A. The odd-numbered common connection sections 107B are disposed outside of the other end of each of the odd-numbered sub bit lines BL1, BL3, . . . in the first direction A. The odd-numbered common connection sections 107B are connected to each of the odd-numbered sub control gate lines CG1, CG3, formed of the first metal interconnect layer, through contacts. Each of the odd-numbered sub control gate lines CG1, CG3, extends to the odd-numbered sub control gate select circuit 212 in the first select region 220, as shown in FIG. 11.

The even-numbered sub bit select circuit 216 formed in the first select region 220 includes transistors 230 and 232 which selectively connect either the even-numbered sub bit line BL0 or the even-numbered sub bit line BL2 with the main bit line MBL0, which is the third metal interconnect layer, based on the potential of the select signal lines SEL(BL)0 and SEL(BL)2, as shown in FIG. 10. Transistors 234 and 236 connect either the even-numbered sub bit line BL4 or the even-numbered sub bit line BL6 with the main bit line MBL2.

The odd-numbered sub bit select circuit 218 formed in the second select region 222 includes transistors 240 and 242 which selectively connect either the odd-numbered sub bit line BL1 or the odd-numbered sub bit line BL3 with the main bit line MBL1, which is the third metal interconnect layer, based on the potential of the select signal lines SEL(BL)1 and SEL(BL)3, as shown in FIG. 10. Transistors 244 and 246 connect either the odd-numbered sub bit line BL5 or the odd-numbered sub bit line BL7 with the main bit line MBL3.

The odd-numbered sub control gate select circuit 212 formed in the first select region 220 includes transistors 250 and 252 which selectively connect either the odd-numbered sub control gate line CG1 or the odd-numbered sub control gate line CG3 with the main control gate line MCG1, which is the third metal interconnect layer, based on the potential of the select signal lines SEL(CG)1 and SEL(CG)3, as shown in FIG. 11. Transistors 254 and 256 connect either the odd-numbered sub control gate line CG5 or the odd-numbered sub control gate line CG7 with the main control gate line MCG3.

The even-numbered sub control gate select circuit 214 formed in the second select region 222 includes transistors 260 and 262 which selectively connect either the even-numbered sub control gate line CG0 or the even-numbered sub control gate line CG2 with the main control gate line MCG0, which is the third metal interconnect layer, based on the potential of the select signal lines SEL(CG)0 and SEL(CG)2, as shown in FIG. 11. Transistors 264 and 266 connect either the even-numbered sub control gate line CG4 or the even-numbered sub control gate line CG6 with the main control gate line MCG2.

The above-described data read, write (program), and erase operations of the memory cells 100 can be performed by changing the main-sub connection using the respective odd-numbered and even-numbered sub control gate select circuits 212 and 214 and the respective odd-numbered and even-numbered sub bit select circuits 216 and 218 while driving the main control gate line MCG and the main bit line MBL using the main control gate line driver 202 and main bit line driver 204.

In FIG. 10, the select signal line SEL(BL)0 is connected in common with the gates of the transistors 230 and 234. However, two select signal lines SEL(BL) may be used. Other select signal lines SEL(BL)1 to SEL(BL)3 and select signal lines SEL(CG)0 to SEL(CG)3 shown in FIG. 11 may also be divided into two select signal lines.

The present invention is not limited to the above-described embodiment. Various modifications and variations are possible without departing from the spirit and scope of the present invention.

For example, the structure of the nonvolatile memory elements 108A and 108B is not limited to the MONOS structure. The present invention can be applied to a nonvolatile semiconductor memory device using various types of other memory cells capable of independently trapping charges at two sites by one word gate 104 and two control gates 106A and 106B.

The respective even-numbered and odd-numbered sub bit lines BL which are the impurity layers alternately extend in the opposite directions. However, the extending direction may be the same. In this case, the sub bit select circuits 216 and 218 are formed in either the first select region 220 or the second select region 222, and the sub control gate select circuits 212 and 214 are formed in the other.

What is claimed is:

1. A nonvolatile semiconductor memory device comprising:
   a memory cell array region in which a plurality of memory cells are arranged in first and second directions intersecting each other, each of the memory cells having two nonvolatile memory elements and being controlled by one word gate and two control gates; and
   a select region disposed adjacent to the memory cell array region in the first direction,
   wherein the memory cell array region includes:
      a plurality of sub bit lines formed of impurity layers extending to the select region in the first direction, and provided on both sides of the memory cells arranged in the first direction;
      a plurality of control gate lines extending in the first direction, the number of the control gate lines being twice the number of the sub bit lines;
      a plurality of word lines extending in the second direction;
      a plurality of main bit lines extending in the first direction and provided within the select region and the memory cell array region, the number of the main bit lines being smaller than the number of the sub bit lines; and
      a sub bit select circuit which is provided in the select region and selectively connects the sub bit lines with the main bit lines.

2. The nonvolatile semiconductor memory device as defined in claim 1, wherein the select region includes first and second select regions disposed on both sides of the memory cell array region in the first direction.

3. The nonvolatile semiconductor memory device as defined in claim 2, wherein an even-numbered sub bit line among the sub bit lines extends to the first select region; and wherein an odd-numbered sub bit line among the sub bit lines extends to the second select region.

4. The nonvolatile semiconductor memory device as defined in claim 3, wherein the first select region includes an even-numbered sub bit select circuit which selectively connects the even-numbered sub bit line with even-numbered main bit line among the main bit lines; and wherein the second select region includes an odd-numbered sub bit select circuit which selectively connects the odd-numbered sub bit line with odd-numbered main bit line among the main bit lines.

5. The nonvolatile semiconductor memory device as defined in claim 3, wherein the memory cell array region includes a plurality of common connection sections each of which connects two of the control gate lines disposed on both sides of each of the sub bit lines, at one end portion of the memory cell array region on the side opposite to the side on which the sub bit line between the two of the control gate lines extends to the select region; and wherein a plurality of sub control gate lines connect the common connection sections to the select region, the number of the sub control gate lines being equal to the number of the sub bit lines.

6. The nonvolatile semiconductor memory device as defined in claim 5, wherein a plurality of main control gate lines are provided to extend in the first direction in the select region and the memory cell array region, the number of the main control gate lines being smaller than the number of the sub control gate lines; and wherein the select region includes a sub control gate select circuit which selectively connects the sub control gate lines with the main control gate lines.

7. The nonvolatile semiconductor memory device as defined in claim 5, wherein two of the control gate lines on both sides of the odd-numbered sub bit line are connected to each other by an odd-numbered common connection section of the common connection sections at one end in the first direction; and wherein two of the control gate lines on both sides of the even-numbered sub bit line are connected to each other by an even-numbered common connection section of the common connection sections at the other end in the first direction.

8. The nonvolatile semiconductor memory device as defined in claim 7, wherein the odd-numbered common connection section is connected to an odd-numbered sub control gate line extending to the first select region; and wherein the even-numbered common connection section is connected to an even-numbered sub control gate line extending to the second select region.

9. The nonvolatile semiconductor memory device as defined in claim 8, wherein the first select region has an odd-numbered sub control gate select circuit which selectively connects the odd-numbered sub control gate line to an odd-numbered main control gate line; and wherein the second select region has an even-numbered sub control gate select circuit which selectively connects the even-numbered sub control gate line to an even-numbered main control gate line.

10. The nonvolatile semiconductor memory device as defined in claim 5, wherein:

a plurality of memory blocks each of which is formed of the memory cell array region and the select region are arranged in the first direction;

a main bit line driver which drives the plurality of main bit lines is provided on one end of the arranged memory blocks in the first direction; and a main control gate line driver which drives the plurality of main control gate lines is provided on the other end of the arranged memory blocks in the first direction.

11. The nonvolatile semiconductor memory device as defined in claim 5, wherein the plurality of sub control gate lines form a first metal interconnect layer.

12. The nonvolatile semiconductor memory device as defined in claim 11, wherein a second metal interconnect layer is connected to the plurality of word lines.

13. The nonvolatile semiconductor memory device as defined in claim 12, wherein the plurality of main bit lines and the plurality of main control gate lines form a third metal interconnect layer.

14. The nonvolatile semiconductor memory device as defined in claim 1, wherein a plurality of memory blocks each of which is formed of the memory cell array region and the select region are arranged in the first direction.

15. The nonvolatile semiconductor memory device as defined in claim 14, wherein a main bit line driver which drives the plurality of main bit lines is provided on one end of the arranged memory blocks in the first direction.

16. The nonvolatile semiconductor memory device as defined in claim 15, wherein a word line driver which drives the word lines is provided on either side of the arranged memory blocks in the second direction.

17. The nonvolatile semiconductor memory device as defined in claim 16, wherein the plurality of memory blocks are disposed on both sides of the word line driver in the second direction.

18. The nonvolatile semiconductor memory device as defined in claim 1, wherein each of the two nonvolatile memory elements has an ONO film consisting of an oxide film (O), nitride film (N), and oxide film (O) as a charge trap site.

* * * * *